United States Patent [19]

Chan et al.

[11] Patent Number: 5,137,842
[45] Date of Patent: Aug. 11, 1992

[54] STACKED H-CELL CAPACITOR AND PROCESS TO FABRICATE SAME

[75] Inventors: Hiang C. Chan; Pierre Fazan, both of Boise, Id.

[73] Assignee: Micron Technology, Inc., Boise, Id.

[21] Appl. No.: 699,291

[22] Filed: May 10, 1991

[51] Int. Cl.$^5$ .................... H01L 21/265; H01L 21/70
[52] U.S. Cl. .......................... 437/48; 437/52; 437/60; 437/228
[58] Field of Search ................... 437/52, 61, 919, 228; 357/23.6, 51; 365/149; 156/643

[56] References Cited

U.S. PATENT DOCUMENTS

| | | | |
|---|---|---|---|
| 4,742,018 | 5/1988 | Kimura et al. | 437/48 |
| 5,049,957 | 9/1991 | Inoue et al. | 437/52 |
| 5,095,364 | 3/1992 | Bae et al. | 357/23.6 |
| 5,108,948 | 4/1992 | Sandhu et al. | 437/48 |

OTHER PUBLICATIONS

"Crown-Shaped Stacked-Capacitor Cell for 1.5 V Operation 64-Mb DRAM's" by Toru Kaga, et al., pp. 255-261, 1991 IEEE.
"3-Dimensional Stacked Capacitor Cell for 16M and 64M DRAMS" by T. Ema et al., pp. 592-595, IEDM 88, '91.
"A New Stacked Capacitor Cell With Thin Box Structured Storage Node" by S. Inoue, etal., pp. 141-144, '91.
"A Novel Stacked Capacitor Cell For 64Mb DRAM" by W. Wakamiye, et al., pp. 69-70, '91.

Primary Examiner—Olik Chaudhuri
Assistant Examiner—Loc Q. Trinh
Attorney, Agent, or Firm—David J. Paul

[57] ABSTRACT

An existing stacked capacitor fabrication process is modified to construct a three-dimensional stacked capacitor, referred to as a Stacked H-Cell (SHC). The SHC design defines a capacitor storage cell that in the present invention is used in a DRAM process. The SHC is made up of a polysilicon storage node structure having a H-shaped cross-sectional upper portion with a lower portion extending downward and making contact to an active area via a buried contact. The polysilicon storage node structure is overlaid by polysilicon with a dielectric sandwiched in between to form a completed SHC capacitor. The novel 3-dimensional shaped polysilicon storage node plate having an H-shaped cross-section, allows substantial capacitor plate surface area of 200% or more to be gained at the storage node over that of a conventional STC.

20 Claims, 12 Drawing Sheets

STACKED H-CELL CAPACITOR AND PROCESS TO FABRICATE SAME

FIELD OF THE INVENTION

This invention relates to semiconductor circuit memory storage devices and more particularly to a process for fabricating three-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate charge or capacitance in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continues to increase for future generations of memory devices.

The ability to densely pack storage cells while maintaining required capacitance levels is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, two or more layers of a conductive material such as polycrystalline silicon (polysilicon or poly) are deposited over an access device on a silicon wafer, with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

However, it is difficult to obtain sufficient storage capacitance with a conventional STC capacitor as the storage electrode area is confined within the limits of its own cell area. Also, maintaining good dielectric breakdown characteristics between poly layers in the STC capacitor becomes a major concern once insulator thickness is appropriately scaled.

A paper submitted by T. Ema, et al., entitled "3-DIMENSIONAL STACKED CAPACITOR CELL FOR 16M AND 64M DRAMS," IEDM, Dig. Tech. Papers, pp. 592-595, 1988, herein incorporated by reference, discusses a 3-dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the polysilicon fins (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins making up the cell plate is much larger than minimum feature size. In addition, the process flow needed to realize this fin structure requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by S. Inoue et al., entitled "A New Stacked Capacitor Cell with Thin Box Structured Storage Node," Ext. Abst., 21st Conf. on S.S.D.M., pp. 141-144, 1989, herein incorporated by reference, discusses a Box STC. The Box STC increases effective capacitance area by expanding the inner surface of the storage node.

The present invention further develops an existing stacked capacitor fabrication process without adding any photolithography steps to construct a three-dimensional stacked capacitor cell having an H-shaped cross-section. the capacitor's bottom plate (or storage node plate) is running parallel to digit lines and is connected to an access transistor's active area by a is self-aligned buried contact (or node contact). Additionally, the storage node does not need to be critically aligned on the node contact which allows the manufacture of a smaller cell area for a given lithographic resolution.

SUMMARY OF THE INVENTION

The invention is directed to maximizing storage cell surface area in a high density/high volume DRAM (dynamic random access memory) fabrication process. An existing stacked capacitor fabrication process is modified to construct a three-dimensional stacked capacitor having an H-shaped cross-section, referred to hereinafter as a Stacked H-Cell or SHC. The SHC design defines a capacitor storage cell that in the present invention is used in a DRAM process, however it will be evident to one skilled in the art to incorporate these steps into other processes requiring memory cells such as VRAMs or the like.

After a silicon wafer is prepared using conventional process steps, the present invention develops the SHC by depositing and patterning two interconnecting layers of polysilicon separating at specific areas to form the storage node structure having an H-shaped cross-section running parallel to digit lines. The 3-dimensional H-shaped structure results in increased capacitor plate surface area for each storage cell. Such a structure is a vast improvement over the STC cell by maximizing the area available for a storage node.

DETAILED DESCRIPTION OF THE PREFERRED EMBODIMENT

The invention is directed to maximizing storage cell surface area in a high density/high volume DRAM fabrication process, in a sequence shown in FIGS. 1-12.

A silicon wafer is prepared using conventional process steps up to the point of defining a cell array. Fabrication of word lines, digit lines and a capacitor cell of the present invention will now follow.

The capacitor of each cell will make contact with a buried contact within the cell, while the capacitor will extend to the active area of an adjacent cell. Each active area within the array is isolated from one another by a thick field oxide. The active areas can be arranged in interdigitated columns and non-interdigitated rows or simply parallel and in line to one another in both the vertical and horizontal directions. The active areas are used to form active MOS transistors that can be doped as NMOS or PMOS type FETs depending on the desired use.

Figure 1:
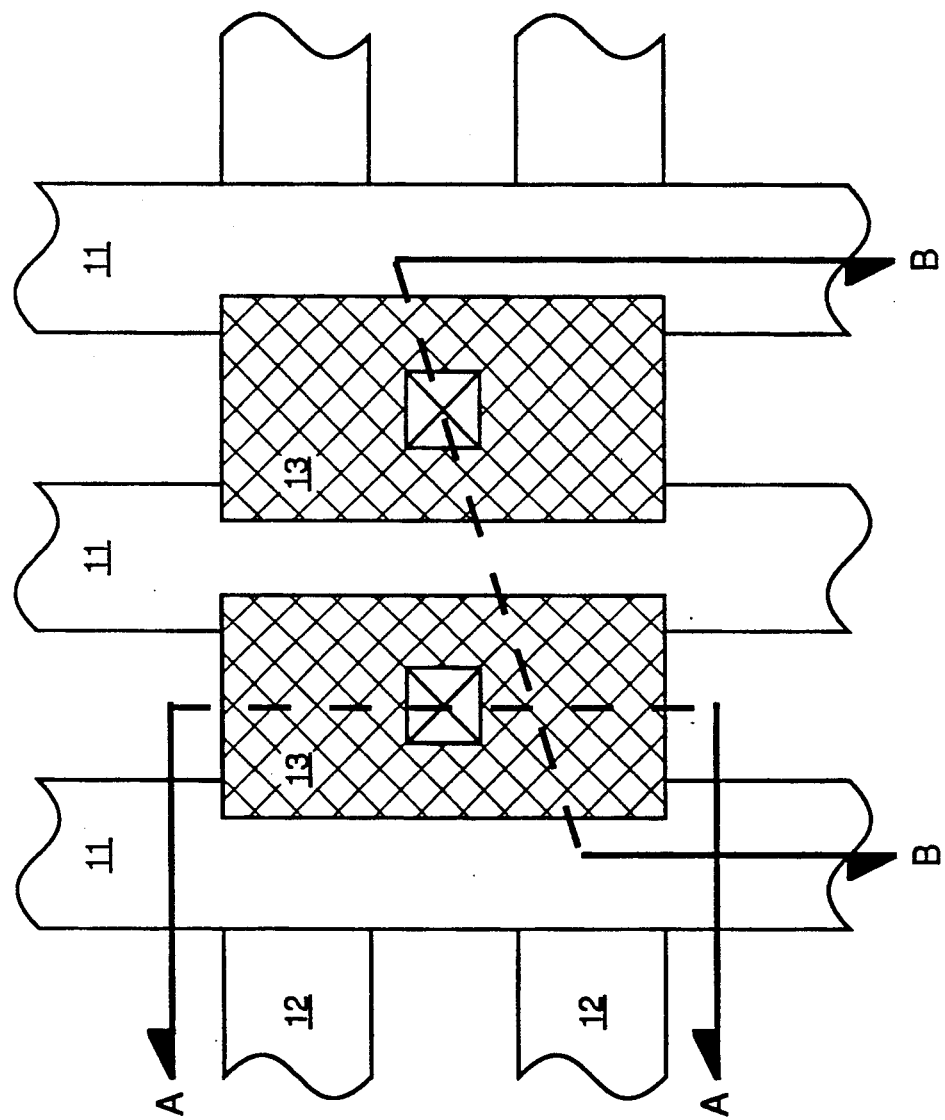
FIG. 1 is a top planar view of a portion of an in-process wafer showing digit lines, word lines and storage capacitors.

FIG. 1 shows a top planar view portion of a completed multilayered memory array with the main building blocks comprising digit lines 11, word lines 12 and a storage node plate 13 of a SIC capacitor.

Figure 2:
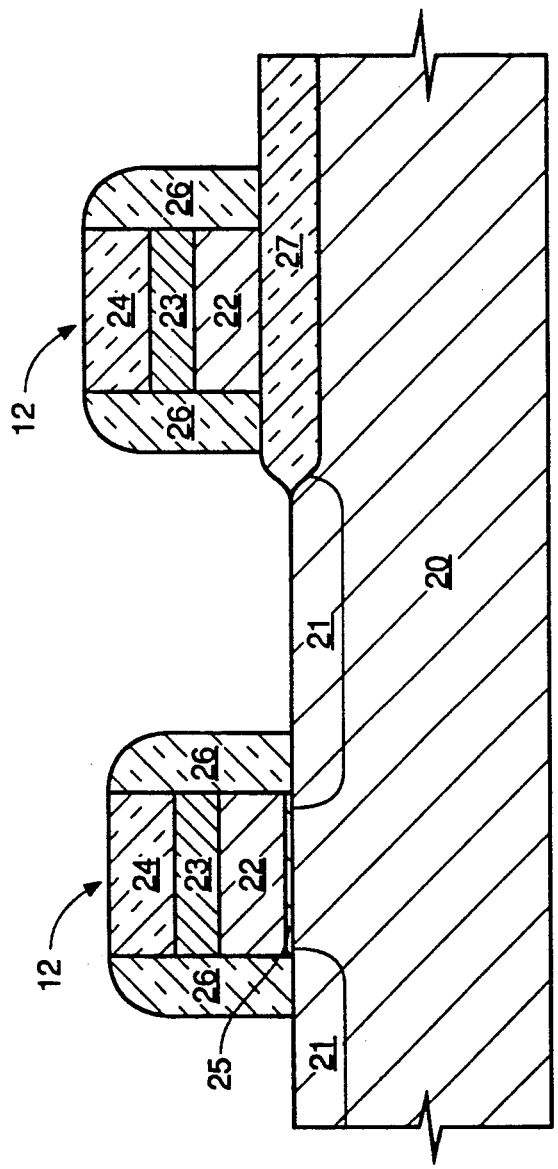
FIG. 2 is a cross-sectional view through broken line A—A of FIG. 1.

As shown in FIG. 2, poly 22, covered with silicide 23 and dielectric 24 (either oxide or nitride) are patterned to serve as word lines 12. Silicide 23 may be selected from such silicides as tungsten silicide (WSi$_2$), titanium silicide (TiSi$_2$) or the like. Poly 22 is conductively doped in order to combine with silicide 23 to form the conductor for word lines 12. Word lines 12 are further isolated from one another as well as subsequent conductive layers by dielectric spacers 26 (also either oxide or nitride). Word lines 12 have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to and over word lines 12.

Figure 3:
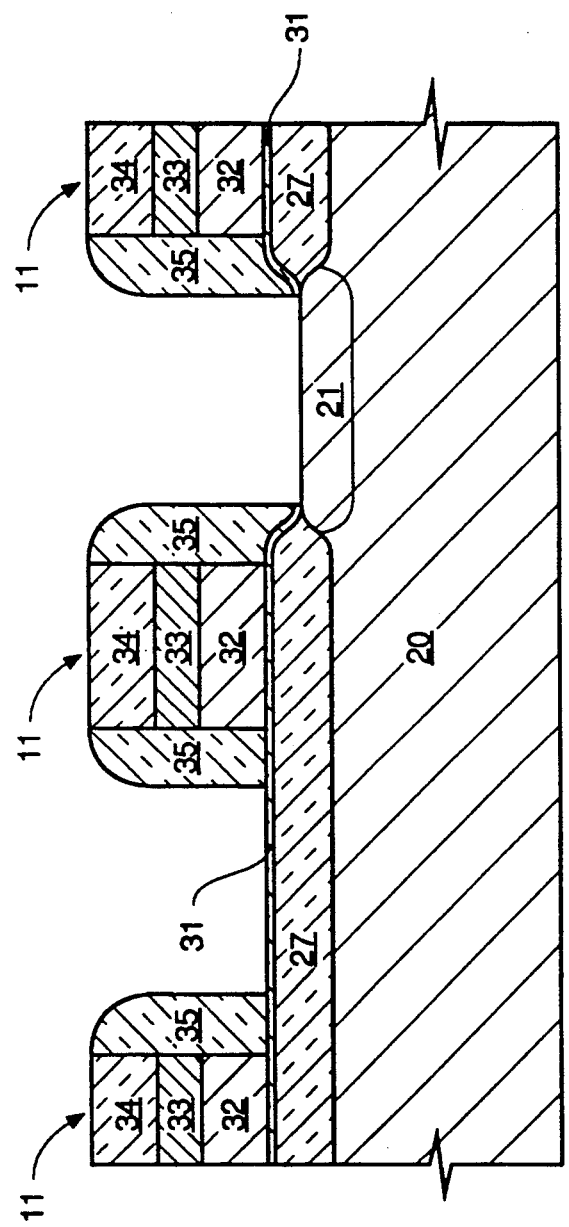
FIG. 3 is a cross-sectional view through broken line B—B of FIG. 1.

FIG. 3 shows the formation of digit lines 11. A conformal layer of dielectric 31 is deposited over the existing wafer surface to isolate previously formed active areas 21 from the subsequent formation of digit lines 11. First, buried digit line contacts are patterned and etched through dielectric 31 allowing access to active areas 21 at the desired locations (the buried digit line contacts cannot be seen in the cross-section of FIG. 3). Second, digit lines 11 are made up of patterned layers consisting of polysilicon 32, silicide 33 and dielectric 34 following the location of the buried digit line contacts. Dielectric 34 can be either nitride or oxide and is deposited by chemical vapor deposition (CVD) which is preferred for its excellent conformity. Polysilicon 32 has previously been conductively doped to electrically couple with silicide 33 to serve as the conductor for digit lines 11. Silicide 33 may be selected from such silicides as tungsten silicide (WSi$_2$), titanium silicide (TiSi$_2$) or the like. Digit lines 11 run perpendicular to and over the top of word lines 12 (shown in FIG. 2) and conform to the wafer surface resulting in a waveform-like topology running in both the digit line and word line directions. A second dielectric, such as nitride or oxide is now deposited, followed by an anisotropic etch to form vertical dielectric spacers 35.

Up to this point, process flow has followed that of an array comprising conventional stacked capacitor cells. From this point forward, the process is unique to an array having SHC-type storage capacitors.

FIGS. 4-12 show the process steps of the preferred embodiment as seen from the cross-sectional view of FIG. 2, showing a cross-section of parallel word lines 12 to present clearer views of the present invention. Therefore, the preferred embodiment will be described from here on as seen from the word line cross-section.

Figure 4:
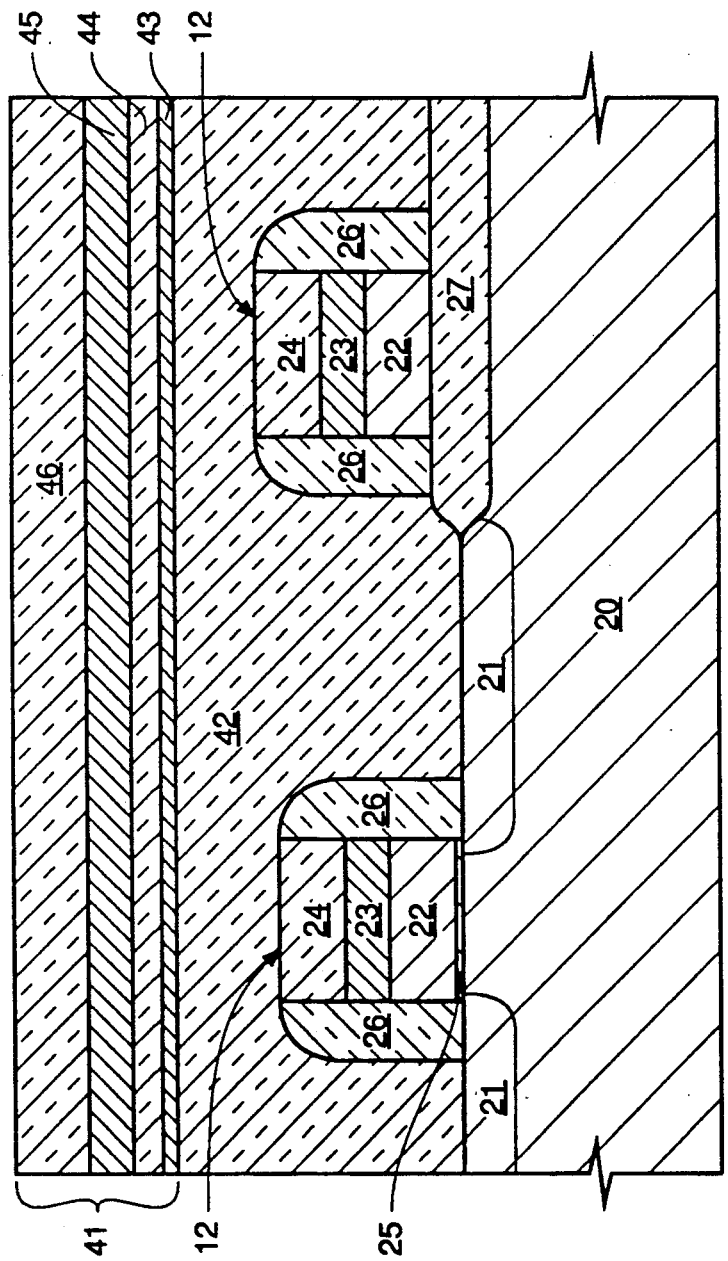
FIG. 4 is a cross-sectional view of the in-process wafer portion of FIG. 2 after depositions of conformal dielectric layers over existing digit lines (not shown) and word lines (shown), said dielectric layers comprised of a first oxide layer, a first nitride layer, a second oxide layer, a second nitride layer and a third oxide layer, respectively.

As shown in FIG. 4, word lines 12 are covered with dielectric 41 comprising of a thick first oxide layer 42, a thin first nitride layer 43, a thin second oxide layer 44, a thick second nitride layer 45 and a thick third oxide layer 46. The thickness of each dielectric layer is not critical except for third oxide layer 46 as its thickness helps determine the desired height of the later to be completed storage node plate. It is important however, that there be alternating layers of oxide and nitride which will become apparent later on in the process.

Figure 5:
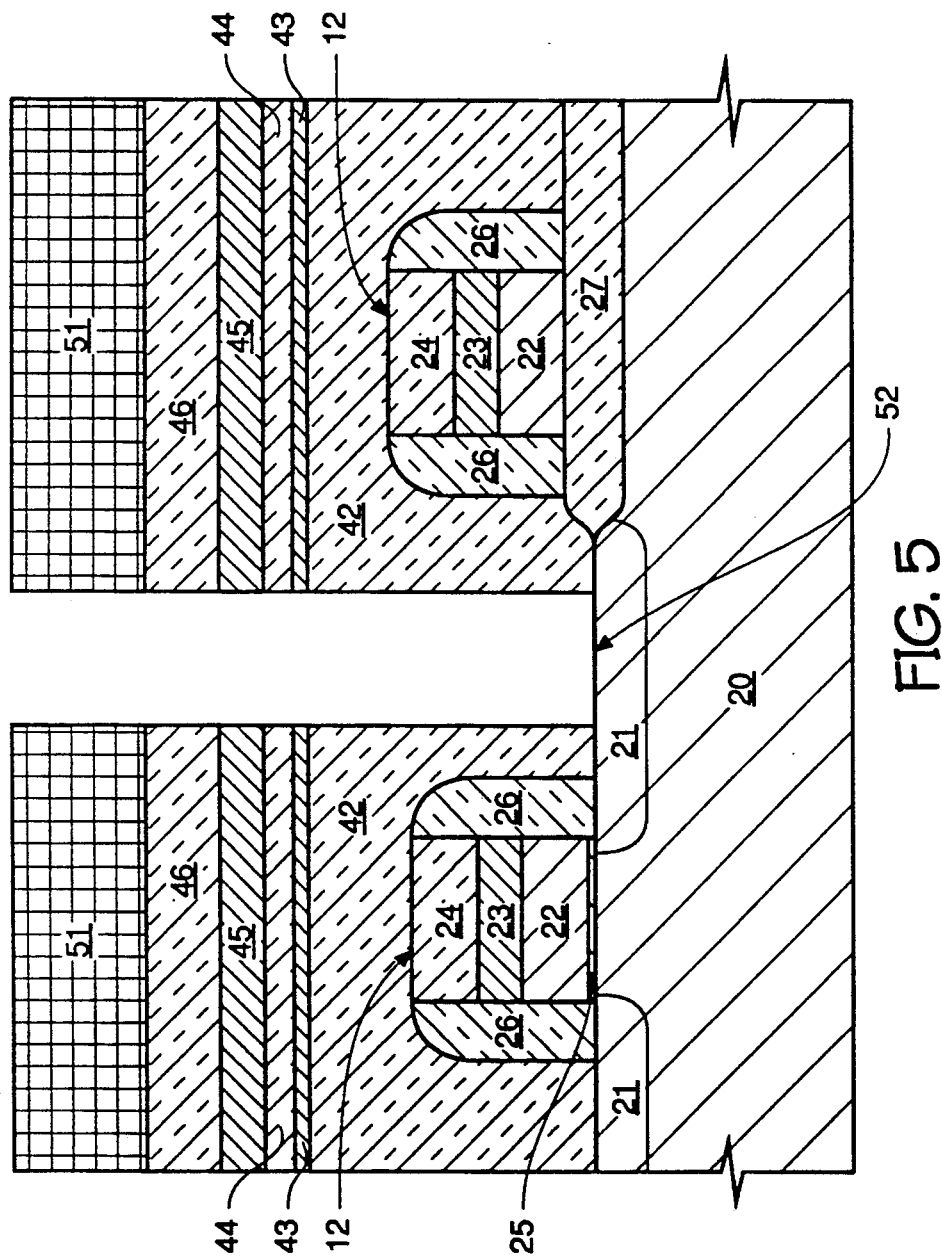
FIG. 5 is a cross-sectional view of the in-process after portion of FIG. 4 after a buried contact photo and etch.

As shown in FIG. 5, a self aligned buried contact to active area 21 is located by coating the wafer surface with photoresist 51. Then after applying the appropriate photomask, an anisotropic etch provides an opening for buried contact 52 thus allowing access to active area 21.

Figure 6:
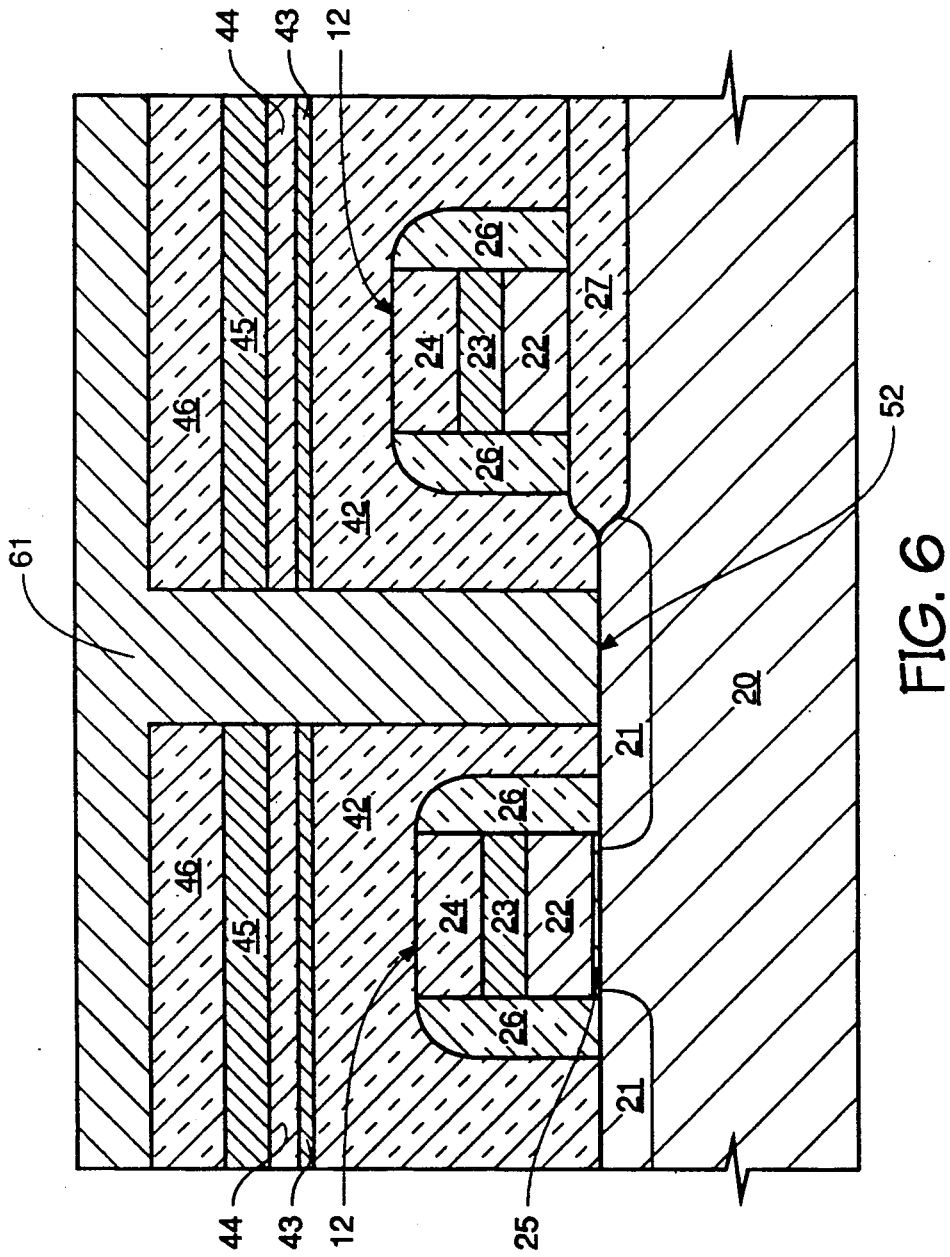
FIG. 6 is a cross-sectional view of the in-process wafer portion of FIG. 5 after a first polysilicon deposition and planarization.

As shown in FIG. 6, the photoresist 51 (of FIG. 5) has been stripped and a thick layer of conformal polysilicon 61 is deposited and planarized. Conformal poly layer 61 connects to active area 21 via buried contact 52.

Figure 7:
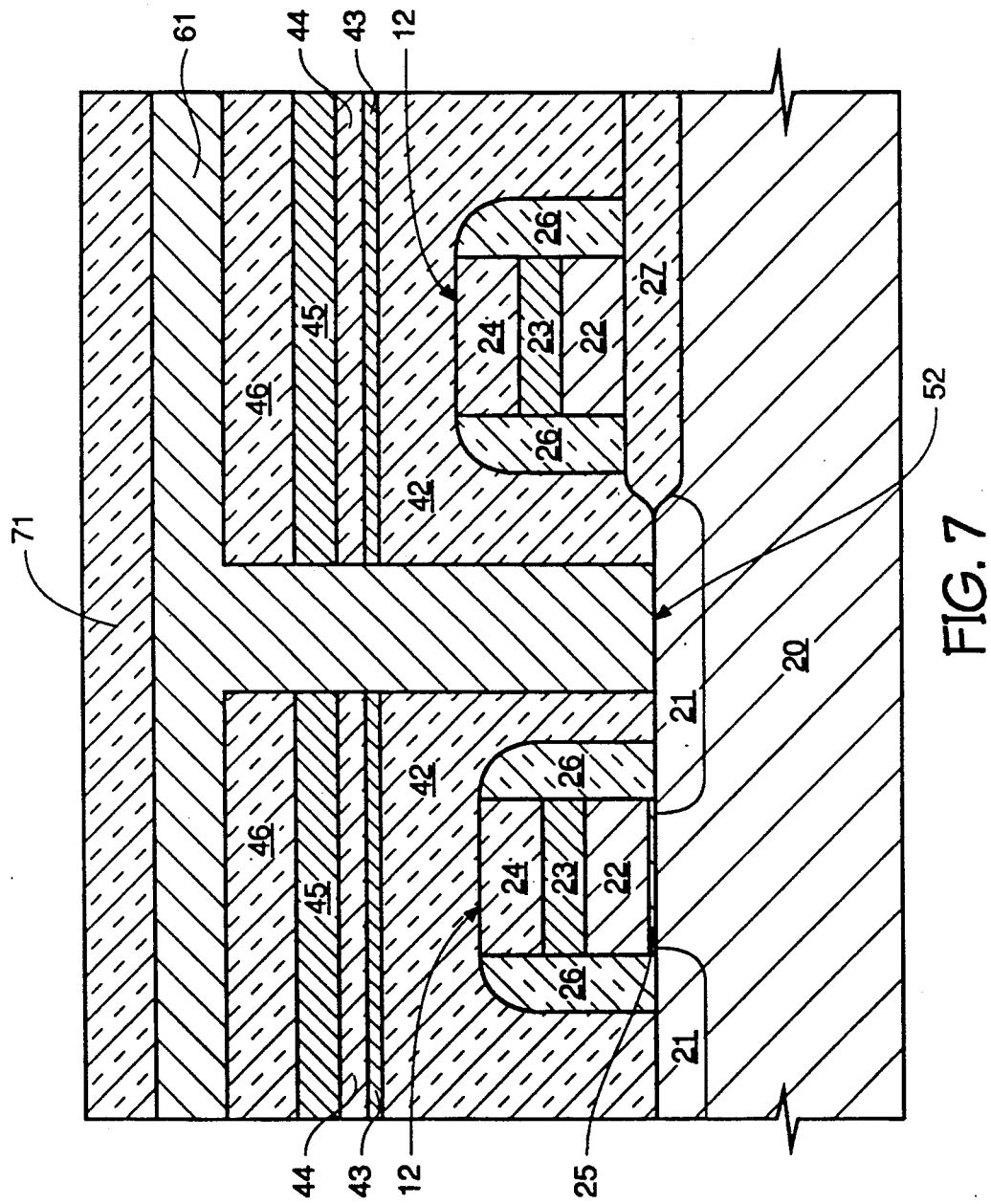
FIG. 7 is a cross-sectional view of an in-process wafer portion of FIG. 6 after a deposition and planarization of a thick oxide.

As shown in FIG. 7, a conformal layer of thick oxide 71 is deposited, preferably by CVD and then planarized. The height of oxide 71 deposited is controlled as it in combination with oxide layer 46 play an important role in determining the overall surface area of the SHC yet to be completed.

Figure 8:
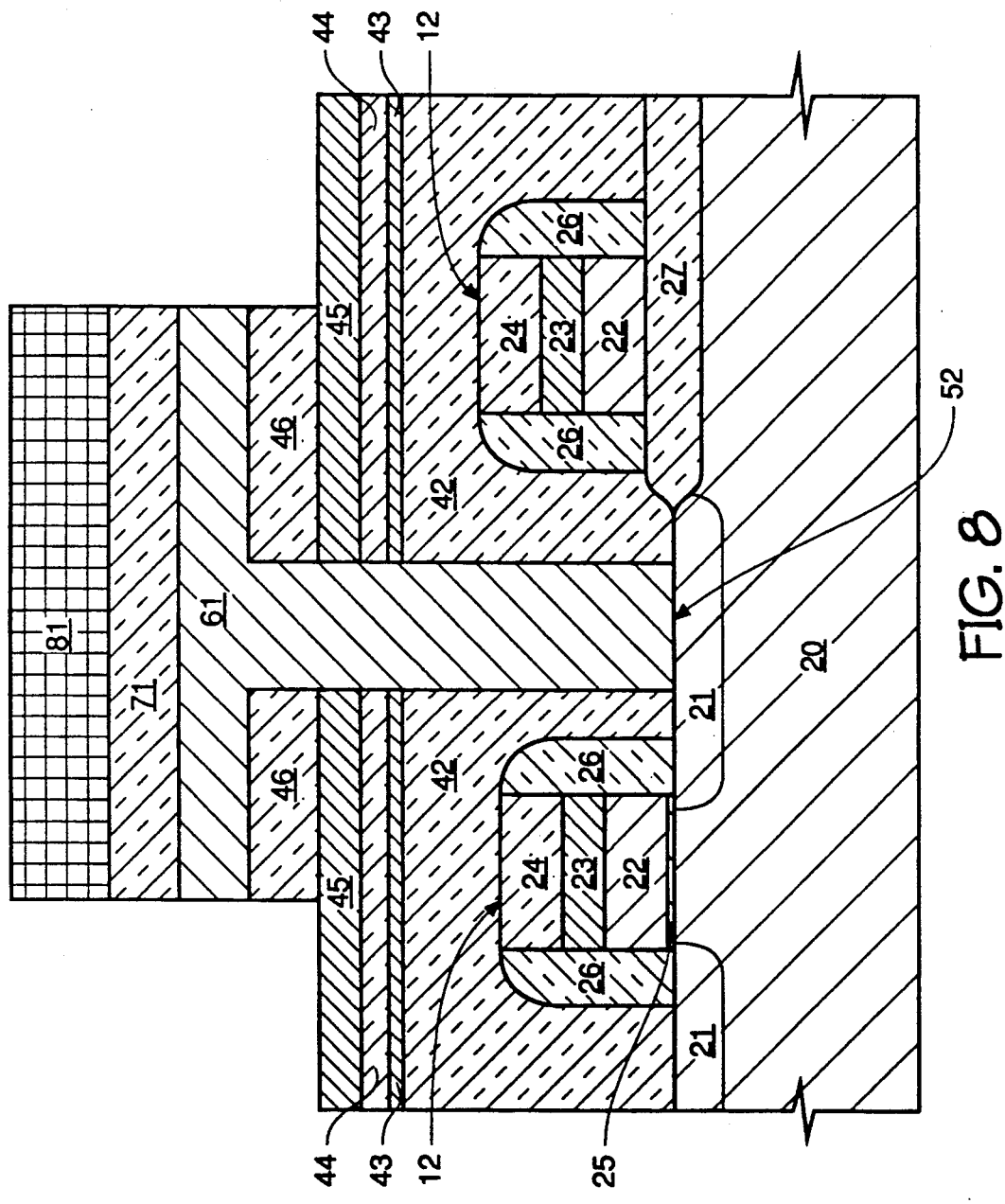
FIG. 8 is a cross-sectional view of an in-process wafer portion of FIG. 7 after a patterning of a storage node plate.

As shown in FIG. 8, portions of oxide 71, polysilicon 61 and oxide 46 are patterned (preferably centered over buried contact 52) by applying an appropriate photomask to photoresist 81 and etching away the unprotected areas of oxide 71, polysilicon 61 and oxide 46, with the etch stopping on second nitride layer 45.

Figure 9:
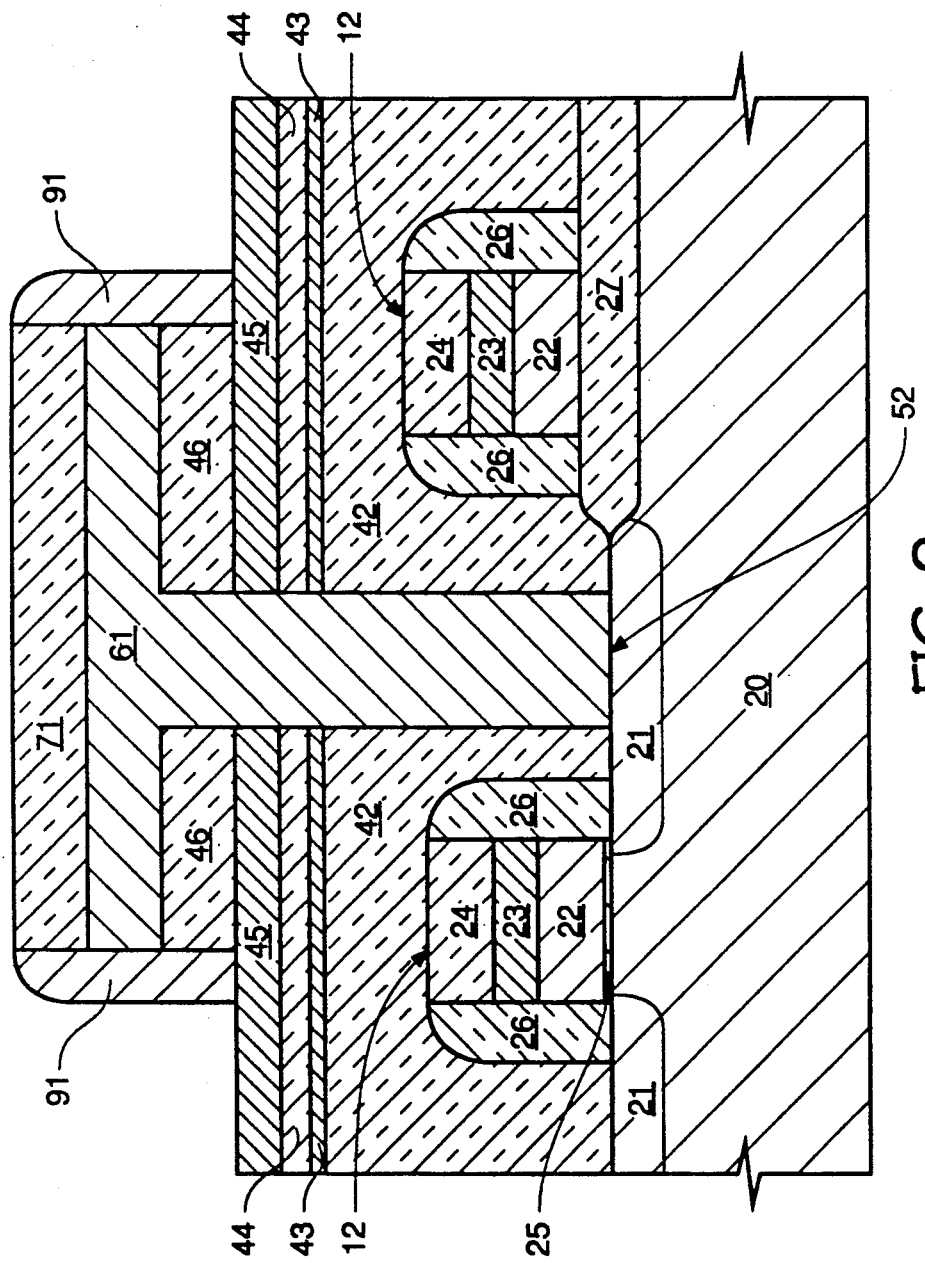
FIG. 9 is a cross-sectional view of the in-process wafer portion of FIG. 8 after a photoresist strip, a second polysilicon deposition and a second polysilicon etch back to form polysilicon spacers.

As shown in FIG. 9, photo resist 81 (of FIG. 8) has been stripped and a layer of polysilicon is deposited, followed by a polysilicon etch back that exposes oxide 71 and forms poly spacers 91 that connects to the exposed edges of patterned poly 61.

Figure 10:
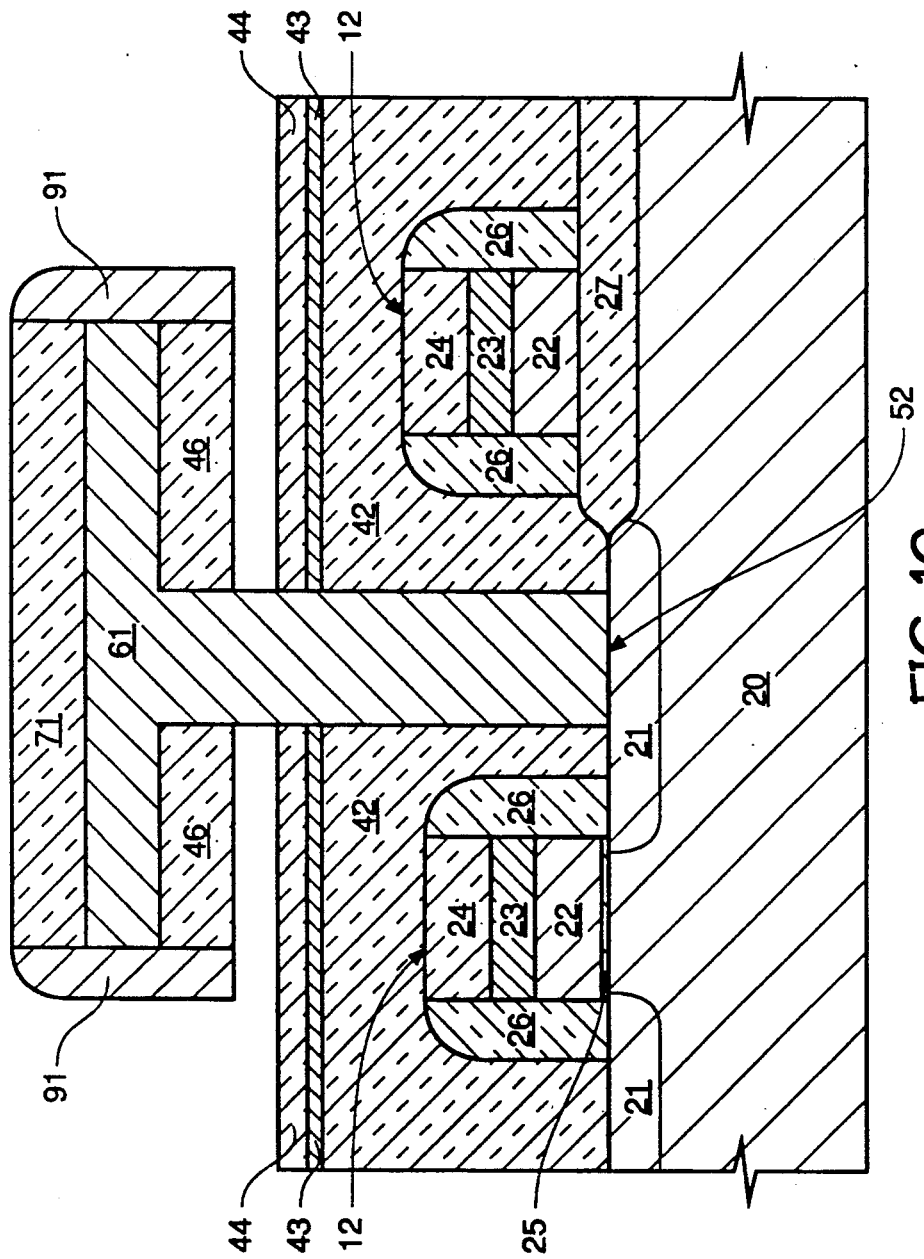
FIG. 10 is a cross-sectional view of the in-process wafer portion of FIG. 9 after etching of the second nitride layer.

As shown in FIG. 10, second nitride layer 45 is etched away thereby exposing oxides 44 and 46. Now oxides 44, 46 and 71 are removed by an oxide etch which leaves a poly structure having an H-shaped cross-section made up of patterned poly 61 and poly spacers 91. This cross-sectional H-shaped poly structure is now doped to the desired conductivity type (p-type or n-type) to serve as a conductive polysilicon storage node plate 111.

Figure 11:
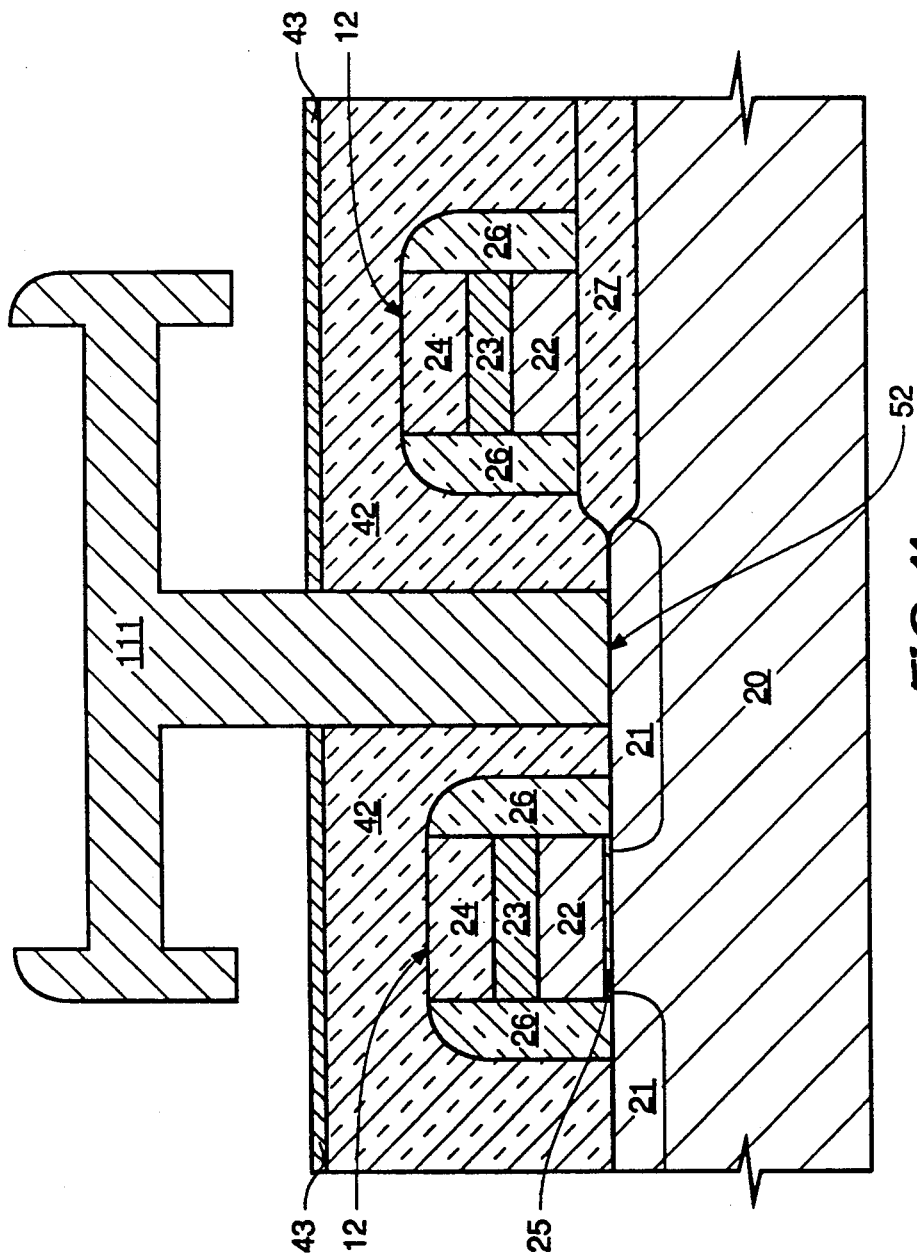
FIG. 11 is a cross-sectional view of the in-process wafer portion of FIG. 10 after etching the second, third and fourth oxide layers.
Figure 12:
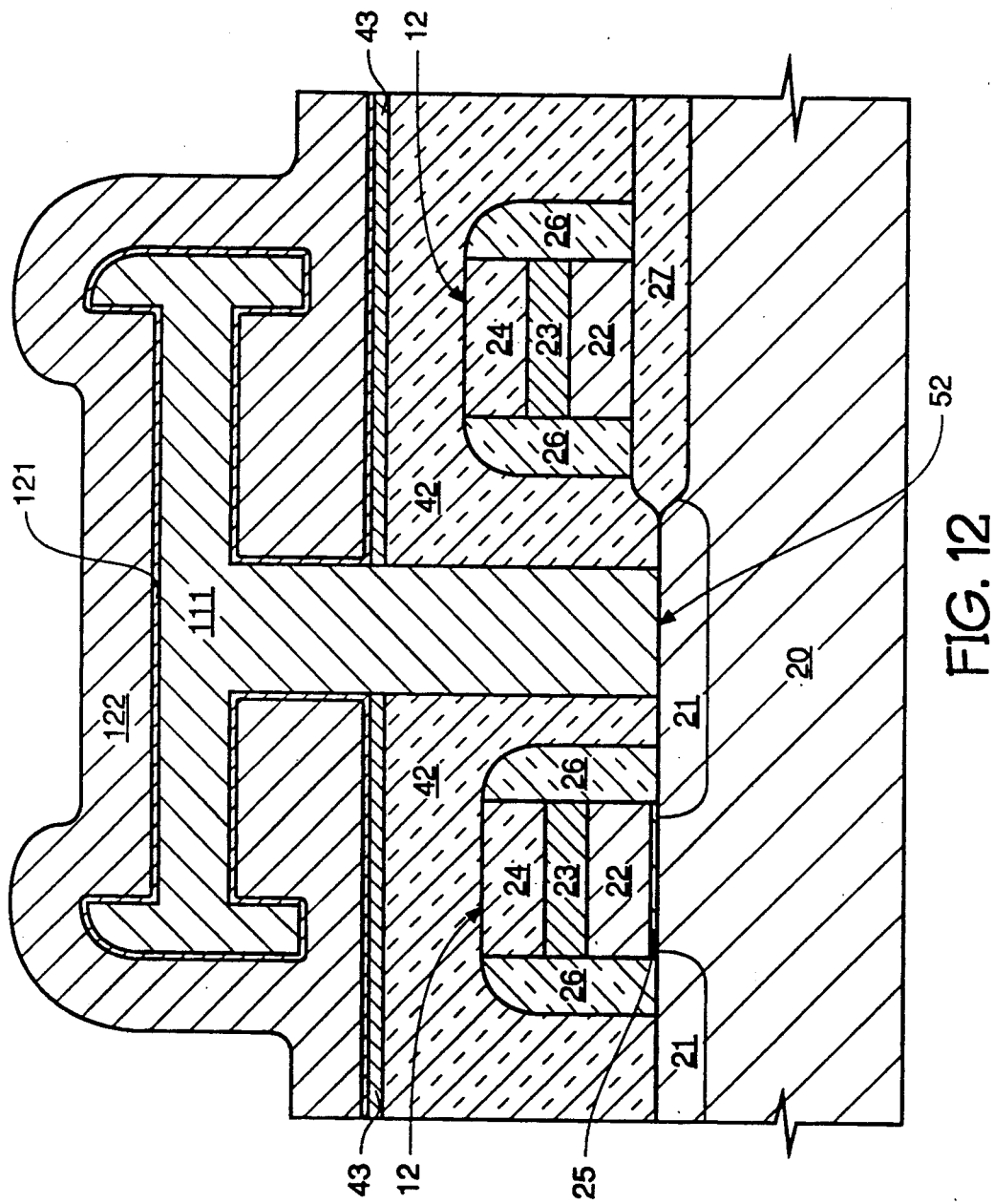
FIG. 12 is a cross-sectional view of the in-process wafer portion FIG. 11 following blanket depositions of a conformal cell dielectric and a third polysilicon.

As shown in FIG. 11, following poly plate 111 doping, a dielectric layer of nitride 121 is deposited that conforms to poly storage node plate 111. Nitride 121 serves as a capacitor dielectric for the SHC. Although nitride 121 is selected as the capacitor dielectric in the preferred embodiment, any material having a high dielectric constant such as $Ta_2O_5$ or $SrTiO_3$ could be used. Also, the nitride or $Ta_2O_5$ layers can be oxidized. Following nitride 121 deposition, a blanket deposition of conformal poly 122 is deposited. Poly 122 is conductively doped either n-type or p-type depending on the conductivity type desired for active area 21. Poly 122 now serves as a top poly capacitor cell plate of the SHC storage capacitor which also becomes a common cell plate to all SHC storage capacitors in the array. All conformal polysilicon layers used to create the SHC capacitor are preferably deposited by CVD although other conformal deposition methods could be used as well.

With the unique H-shape of poly storage node plate 111 along with top poly capacitor cell plate 122 that envelops plate 111, substantial capacitor plate surface area is gained at the storage node. Since capacitance is mainly effected by the surface area of a capacitor's cell plates the additional area gained by a 3-dimensional H-shaped cell structure can provide an additional 200% or more increase in capacitance over that of a conventional STC capacitor, without more space than that required for defining a stacked capacitor storage cell. Higher density for a given capacitance is possible as a smaller cell area is realized.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM array on a silicon substrate, said process comprising the steps of:
    creating a plurality of separately isolated active areas arranged in parallel rows and parallel columns;
    creating a gate dielectric layer on top of each active area;
    depositing a first conductive layer superjacent surface of said array;
    depositing a first dielectric layer superjacent said first conductive layer;
    masking and etching said first conductive and said first dielectric layers to form a plurality of parallel conductive word lines aligned along said rows such that each said word line passes over an inner portion of each said active area being separated therefrom by a remanent of said gate dielectric layer;
    depositing and etching vertical dielectric spacers adjacent said word lines;
    creating a conductively-doped digit line junction and storage node junction within each said active area on opposite sides of each said word line;
    depositing a second dielectric layer superjacent said array surface;
    creating a first aligned buried contact location at each said digit line junction in each said active area;
    depositing a second conductive layer superjacent said array surface, said second conductive layer making direct contact to said digit line junctions at said first buried contact locations;
    depositing a third dielectric layer superjacent said second conductive layer;
    masking and etching said second conductive layer and said third dielectric layer to form a plurality of parallel conductive digit lines aligned along said columns such that a digit line makes electrical contact at each digit line junction within a column, said digit lines running perpendicular to and over said word lines forming a 3-dimensional topology;
    depositing and planarizing a fourth dielectric layer superjacent said array surface;
    depositing a fifth dielectric layer superjacent said planarized fourth dielectric layer;
    depositing a sixth dielectric layer superjacent said fifth dielectric layer;
    depositing a seventh dielectric layer superjacent said sixth dielectric layer;
    depositing a eighth dielectric layer superjacent said seventh dielectric layer;
    creating a second aligned buried contact location at each said storage node junction in each said active area;
    depositing a third conductive layer superjacent said array surface assuming a surface in response to existing topology, said third conductive layer making contact to said storage node junctions at said second buried contact locations;
    etching back said third conductive layer thereby forming a planarized surface on said third conductive layer;
    depositing and planarizing a ninth dielectric layer superjacent said third conductive layer;
    masking and etching said ninth dielectric layer, said third conductive layer and said eighth dielectric layer, thereby patterning a lower portion of a conductive storage node plate, said patterning aligning the lower storage node plate to the center of each associated second buried contact;
    depositing a fourth conductive layer superjacent existing wafer topology;
    etching said fourth conductive layer thereby forming poly spacers adjacent said exposed edges of said patterned ninth dielectric layer, said patterned third conductive layer and said patterned eighth dielectric layer, said etching exposing said seventh dielectric layer;
    etching said seventh dielectric layer, thereby exposing said sixth dielectric layer;
    etching said ninth, said eighth and said sixth dielectrics thereby creating individual conductive storage node plates having an H-shaped cross-section;
    depositing a cell dielectric layer adjacent and coextensive said storage node plate and adjacent said array surface; and
    depositing a fifth conductive layer adjacent and coextensive with said cell dielectric layer to form a cell plate common to the entire memory array.

2. A process as recited in claim 1, wherein said gate dielectric layer is oxide.

3. A process as recited in claim 1, wherein said first and said second conductive layers comprise a layer of silicide and doped polysilicon.

4. A process as recited in claim 3, wherein said silicide layer is a material selected from the group consisting essentially of tungsten silicide and titanium silicide.

5. A process as recited in claim 1, wherein said first, said second, said third, said fourth, said fifth, said sixth, said seventh, said eighth and said ninth dielectric layers comprise a material selected from the group consisting of oxide and nitride.

6. A process as recited in claim 1, wherein said fourth, said sixth, said eighth and said ninth dielectric layers are oxide.

7. A process as recited in claim 1, wherein said fifth and said seventh dielectric layers are nitride.

8. A process as recited in claim 1, wherein said first buried contacts are self aligned.

9. A process as recited in claim 1, wherein said third, said fourth and said fifth conductive layers are doped polysilicon.

10. A process as recited in claim 8, wherein said doped polysilicon is deposited by chemical vapor deposition.

11. A process as recited in claim 1, wherein said first, said second, said third, said fourth, said fifth, said sixth, said seventh, said eighth and said ninth dielectric layers are deposited by chemical vapor deposition.

12. A process as recited in claim 1, wherein said cell dielectric layer is a material selected from the group consisting of nitride, oxidized nitride, $Ta_2O_5$, oxidized $Ta_2O_5$ and $SrTiO_3$.

13. A process for fabricating a DRAM storage capacitor on a silicon substrate having active areas, word lines and digit lines, said process comprising the steps of:
   depositing and planarizing a first dielectric layer on surface of said silicon, lower portion of said first dielectric layer conforming to existing topology;
   depositing a second dielectric layer superjacent said planarized first dielectric layer;
   depositing a third dielectric layer superjacent said second dielectric layer;
   depositing a fourth dielectric layer superjacent said third dielectric layer;
   depositing a fifth dielectric layer superjacent said fourth dielectric layer;
   creating an aligned buried contact location at each said storage node junction in each said active area;
   depositing a first conductive layer superjacent said array surface assuming a surface in response to existing topology, said third conductive layer making contact to said storage node junctions at said second buried contact locations;
   etching back said first conductive layer thereby forming a planarized surface on said first conductive layer;
   depositing and planarizing a sixth dielectric layer superjacent said first conductive layer;
   masking and etching said sixth dielectric layer, said first conductive layer and said fifth dielectric layer, thereby patterning a lower portion of a conductive storage node plate, said patterning aligning the lower storage node plate to the center of each associated second buried contact;
   depositing a second conductive layer superjacent existing wafer topology;
   etching said second conductive layer thereby forming poly spacers adjacent said exposed edges of said patterned sixth dielectric layer, said patterned first conductive layer and said patterned fifth dielectric layer, said etching exposing said fourth dielectric layer;
   etching said fourth dielectric layer, thereby exposing said third dielectric layer;
   etching said sixth, said fifth and said third dielectrics thereby creating individual conductive storage node plates having an H-shaped cross-section;
   depositing a cell dielectric layer adjacent and coextensive with said storage node plate and adjacent said array surface; and
   depositing a third conductive layer adjacent and coextensive with said cell dielectric layer to form a cell plate common to the entire memory array.

14. A process as recited in claim 13, wherein said first, said second, said third, said fourth, said fifth and said sixth dielectric layers comprise a material selected from the group consisting of oxide and nitride.

15. A process as recited in claim 13, wherein said first, said third, said fifth and said sixth dielectric layers are oxide.

16. A process as recited in claim 13, wherein said second and said fourth dielectric layers are nitride.

17. A process as recited in claim 13, wherein said first, said second and said third conductive layers are doped polysilicon.

18. A process as recited in claim 17, wherein said doped polysilicon is deposited by chemical vapor deposition.

19. A process as recited in claim 13, wherein said first, said second, said third, said fourth, said fifth and said sixth dielectric layers are deposited by chemical vapor deposition.

20. A process as recited in claim 13, wherein said cell dielectric layer is a material selected from the group consisting essentially of nitride, oxidized nitride, $Ta_2O_5$, oxidized $Ta_2O_5$ and $SrTiO_3$.

* * * * *

UNITED STATES PATENT AND TRADEMARK OFFICE
CERTIFICATE OF CORRECTION

PATENT NO. : 5,137,842
DATED : August 11, 1992
INVENTOR(S) : Hiang C. Chan et al It is certified that error appears in the above-indentified patent and that said Letters Patent is hereby corrected as shown below:

Column 2, line 64, delete "after" and insert --wafer--.

Signed and Sealed this

First Day of February, 1994

BRUCE LEHMAN

*Attest:*

*Attesting Officer*  *Commissioner of Patents and Trademarks*